United States Patent
Oh

(10) Patent No.: US 8,323,876 B1
(45) Date of Patent: Dec. 4, 2012

(54) METHODS OF FORMING INTEGRATED CIRCUIT DEVICES USING ANTI-PENETRATION FILMS TO BLOCK ACID TRANSFER INTO ANTI-REFLECTIVE COATINGS

(75) Inventor: Tae-Hwan Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 228 days.

(21) Appl. No.: 12/818,408

(22) Filed: Jun. 18, 2010

(51) Int. Cl.
 *G03F 7/26* (2006.01)
(52) U.S. Cl. ......................................... 430/313
(58) Field of Classification Search .................. 430/311, 430/313
 See application file for complete search history.

(56) References Cited

U.S. PATENT DOCUMENTS

| 6,183,940 B1* | 2/2001 | Wang et al. .................... 430/328 |
| 2004/0191479 A1* | 9/2004 | Hatakeyama et al. ........ 428/141 |

FOREIGN PATENT DOCUMENTS

| JP | 2001-022082 | 1/2001 |
| KR | 1020020002903 A | 1/2002 |
| KR | 1020040002006 A | 1/2004 |
| KR | 1020070090196 A | 9/2007 |

* cited by examiner

*Primary Examiner* — Kathleen Duda
*Assistant Examiner* — Caleen Sullivan
(74) *Attorney, Agent, or Firm* — Myers Bigel Sibley & Sajovec, P.A.

(57) ABSTRACT

Provided are a semiconductor structure and a method of fabricating a semiconductor device. The method includes: preparing a substrate or an etch-target layer which is to be patterned; forming a first anti-reflective coating, which contains silsesquioxane resin and a cross-linking catalyst, on the substrate or the etch-target layer; forming an anti-penetration film and a second anti-reflective coating by causing a cross-linking reaction in a region of the first anti-reflective coating; and forming a photoresist pattern on the anti-penetration film.

21 Claims, 8 Drawing Sheets

METHODS OF FORMING INTEGRATED CIRCUIT DEVICES USING ANTI-PENETRATION FILMS TO BLOCK ACID TRANSFER INTO ANTI-REFLECTIVE COATINGS

FIELD OF THE INVENTION

The present invention relates to a semiconductor structure and a method of fabricating a semiconductor device.

BACKGROUND

Etching is of great importance in a semiconductor fabrication process. As semiconductor devices become more highly integrated, photolithography technology is widely used to form fine patterns of the semiconductor devices.

In a photolithography process, a mask pattern such as a photoresist pattern is formed, and an etch-target film is etched using the photoresist pattern as an etch mask. Here, an anti-reflective coating may be employed to reduce reflection of light by the etch-target film during an exposure process of the photolithography process.

SUMMARY

Aspects of the present invention provide a semiconductor structure which prevents acid generated during the formation of a photoresist pattern from diffusing to an underlying film of the photoresist pattern.

Aspects of the present invention also provide a method of fabricating a semiconductor device, the method employed to prevent acid generated during the formation of a photoresist pattern from diffusing to an underlying film of the photoresist pattern.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a semiconductor structure including: an etch-target layer in which a pattern is to be formed; an anti-reflective coating which is disposed on the etch-target layer and contains silsesquioxane resin; an anti-penetration film which is disposed on the anti-reflective coating and has a net structure; and a photoresist pattern which is disposed on the anti-penetration film.

According to another aspect of the present invention, there is provided a method of fabricating a semiconductor device. The method including: preparing a substrate or an etch-target layer which is to be patterned; forming a first anti-reflective coating, which contains silsesquioxane resin and a cross-linking catalyst, on the substrate or the etch-target layer; forming an anti-penetration film and a second anti-reflective coating by causing a cross-linking reaction in a region of the first anti-reflective coating; and forming a photoresist pattern on the anti-penetration film.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
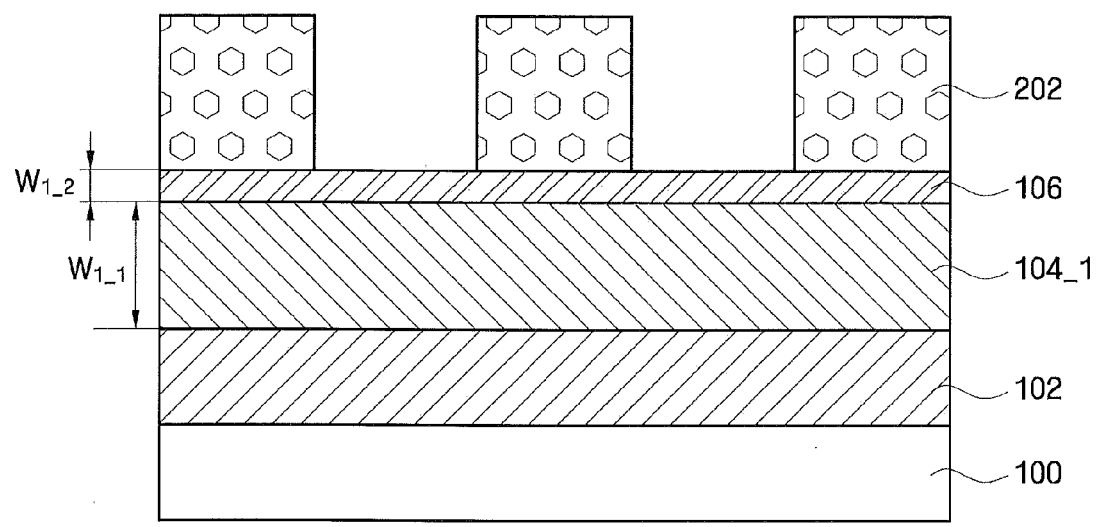
FIG. 1 is a cross-sectional view of a semiconductor structure according to a first exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of components may be exaggerated for clarity. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprising" and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention;

Embodiments of the invention are described herein with reference to (plan and) cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a semiconductor structure and a method of fabricating a semiconductor device according to exemplary embodiments of the present invention will be described with reference to FIGS. 1 through 11.

First, a semiconductor structure according to a first exemplary embodiment of the present invention will now be described with reference to FIG. 1. FIG. 1 is a cross-sectional view of a semiconductor structure according to a first exemplary embodiment of the present invention.

Referring to FIG. 1, the semiconductor structure according to the first exemplary embodiment includes a substrate 100, an etch-target layer 102, an anti-reflective coating 104_1, an anti-penetration film 106, and a photoresist pattern 202.

The substrate 100 forms the basis of the semiconductor structure. The substrate 100 may be a silicon substrate, a silicon on insulator (SOI) substrate, a gallium arsenic substrate, or a silicon germanium substrate.

The etch-target layer 102 may be a material layer formed on the substrate 100. The material layer may be, but is not limited to, a silicon nitride layer, a polysilicon layer, or a silicon oxide layer. The etch-target layer 102 is a layer in which a pattern is to be formed.

For ease of description, the substrate 100 and the etch-target layer 102 are formed as separate layers in the attached drawings of the present invention. However, the substrate 100 may also serve as an etch-target layer. In this case, the semiconductor structure according to the first exemplary embodiment may not include the separate etch-target layer 102.

The anti-reflective coating 104_1 is disposed on the etch-target layer 102. The anti-reflective coating 104_1 can suppress diffused reflection from the etch-target layer 102 which occurs in an exposure process of a lithographic process. As trends toward miniaturization of semiconductor devices continue, finer resist patterns are required, and shorter wavelengths are used. The use of shorter wavelengths is known to cause optical interference during the formation of a resist pattern due to the exposure of a resist layer. That is, exposure light is transmitted through a resist layer, the transmitted light is reflected from a surface of an underlying layer of the resist layer, and part of the reflected light is reflected from a top surface of the resist layer. Since this process is repeated within the resist layer, variations in the thickness of the resist layer affect the critical dimension (CD) of a photoresist pattern obtained after development, thereby deteriorating the dimensional accuracy of the photoresist pattern. Therefore, an anti-reflective coating is used to reduce adverse effects of reflected light, which results from the use of shorter wavelengths, on the formation of resist. The anti-reflective coating 104_1 according to the first exemplary embodiment can also be used for this purpose.

The anti-reflective coating 104_1 may contain silsesquioxane resin. That is, the anti-reflective coating 104_1 may contain mainly silicon. Here, the silsesquioxane resin may include a plurality of hydroxy groups (—OH functional groups). Accordingly, the anti-reflective coating 104_1 may have hydrophilic properties.

The anti-reflective coating 104_1 may be formed to a thickness $W1\_1$ of 10 to 95 nm. When the thickness $W1\_1$ of the anti-reflective coating 104_1 is less than 10 nm, the anti-reflective coating 104_1 cannot fully perform its functions.

Thus, it may be difficult to form a pattern profile of the photoresist pattern 202 which is needed in fabrication of a semiconductor device. On the other hand, when the thickness $W1\_1$ of the anti-reflective coating 104_1 is greater than 95 nm more etching members than necessary may be used to etch the anti-reflective coating 104_1 in a subsequent process. This can undermine the efficiency and economy of the entire process. The anti-reflective coating 104_1 may function as a hard mask in a subsequent patterning process. Accordingly, adjustment of etch skew can be performed easily.

The anti-penetration film 106 is disposed on the anti-reflective coating 104_1. The anti-penetration film 106 prevents acid generated during the formation of the photoresist pattern 202 from penetrating into the anti-reflective coating 104_1.

A photoresist composition used to form the photoresist pattern 202 may contain a photosensitizer. The photosensitizer may be, e.g., a photoacid generator. When exposed to light, the photoacid generator generates acid. Then, the generated acid is likely to diffuse to an underlying film of the photoresist pattern 202. That is, acid contained in a region of in the photoresist pattern 202 may diffuse to the underlying film which contacts the photoresist pattern 202 or is adjacent to the photoresist pattern 202. If the photoresist pattern 202 is formed directly on the anti-reflective coating 104_1, the acid may diffuse to the anti-reflective coating 104_1, causing a footing phenomenon in the photoresist pattern 202. The footing phenomenon deteriorates the overall pattern profile of the photoresist pattern 202, which, in turn, leads to improper formation of the critical dimension of a semiconductor device during the formation of the semiconductor device. Consequently, the semiconductor device may become defective. For this reason, a method of improving the pattern profile of the photoresist pattern 202 by additionally supplying acid to the underlying film of the photoresist pattern 202 and thus supplying acid to the photoresist pattern 202 which is short of acid has been suggested.

According to the first exemplary embodiment of the present invention, the anti-penetration film 106 is disposed between the photoresist pattern 202 and the anti-reflective coating 104_1, thereby preventing interlayer diffusion of acid generated during the formation of the photoresist pattern 202. Accordingly, the deterioration of the pattern profile of the photoresist pattern 202 can be prevented. To this end, the anti-penetration film 106 according to the first exemplary embodiment may be formed in a net structure.

If the anti-penetration film 106 is formed in a net structure, it is difficult for acid generated by a photoacid generator during the formation of the photoresist pattern 202 to pass through the anti-penetration film 106. Accordingly, the interlayer diffusion of the acid can be prevented. Furthermore, according to the first exemplary embodiment of the present invention, the amount of acid additionally supplied to the underlying film of the photoresist pattern 202 in order to improve the pattern profile of the photoresist pattern 202 can be reduced, or the additional supply of acid may not be necessary.

The anti-penetration film 106 may include Si—O—Si bonds. That is, the anti-penetration film 106 may be a net of Si—O—Si bonds. The anti-penetration film 106 containing Si—O—Si bonds may exhibit hydrophobic properties. Thus, if the photoresist pattern 202 is made of an organic material, the first exemplary embodiment of the present invention may have good adhesion at the interface between the photoresist pattern 202 and the anti-penetration film 106.

To prevent penetration of acid generated during the formation of the photoresist pattern 202 into the underlying film of the photoresist pattern 202 and ensure good adhesion to the photoresist pattern 202, the anti-penetration film 106 may include more Si—O—Si bonds than does the anti-reflective coating 104_1. Conversely, the anti-reflective coating 104_1 may include more hydroxy groups (—OH functional groups) of the silsesquioxane resin than does the anti-penetration film 106.

The anti-penetration film 106 may be formed to a thickness $W1\_2$ of 5 to 20 nm. When the thickness $W1\_2$ of the anti-penetration film 106 is less than 5 nm, it may be difficult for the anti-penetration film 106 to prevent acid generated during the formation of the photoresist pattern 202 from diffusing to the underlying film. On the other hand, when the thickness $W1\_2$ of the anti-penetration film 106 is greater than 20 nm, acid generated during the formation of the photoresist pattern 202 can be fully prevented from diffusing to the underlying film. However, more etching members than necessary may be used to etch the anti-penetration film 106 in subsequent processes. This can undermine the efficiency and economy of the entire process.

Based on the above description, a ratio of the thickness $W1\_1$ of the anti-reflective coating 104_1 to the thickness $W1\_2$ of the anti-penetration film 106 may be 0.5 to 19. When the ratio of the thickness $W1\_1$ of the anti-reflective coating 104_1 to the thickness $W1\_2$ of the anti-penetration film 106 is less than 0.5, the anti-reflective coating 104_1 cannot fully perform its functions. Thus, it may be difficult to form a pattern profile of the photoresist pattern 202 which is needed in fabrication of a semiconductor device. In addition, while the anti-penetration film 106 can fully prevent acid generated during the formation of the photoresist pattern 202 from diffusing to the underlying film, more etching members than necessary may be used to etch the anti-penetration film 106 in subsequent processes. This can undermine the efficiency and economy of the entire process.

When the ratio of the thickness $W1\_1$ of the anti-reflective coating 104_1 to the thickness $W1\_2$ of the anti-penetration film 106 is greater than 19, more etching members than necessary may be used to etch the anti-reflective coating 104_1 in a subsequent processes. This can undermine the efficiency and economy of the entire process. In addition, it can be difficult for the anti-penetration film 106 to prevent diffusion of acid generated during the formation of the photoresist pattern 202 into the underlying film.

The photoresist pattern 202 is disposed on the anti-penetration film 106. The photoresist pattern 202, together with the ant-reflective coating 104_1 or the anti-penetration film 106, may be used as a mask for etching the etch-target layer 102. Here, the anti-reflective coating 104_1 or the anti-penetration film 106 may be a hard disk.

The photoresist pattern 202 may be made of an organic material. The photoresist pattern 202 may contain at least one of an acrylate copolymer, an environmentally stable chemically amplified photoresist (ESCAP) copolymer, a cyclo olefin-maleic anhydride (COMA) copolymer, and a hybrid of the COMA copolymer and the acrylate copolymer.

Figure 2:
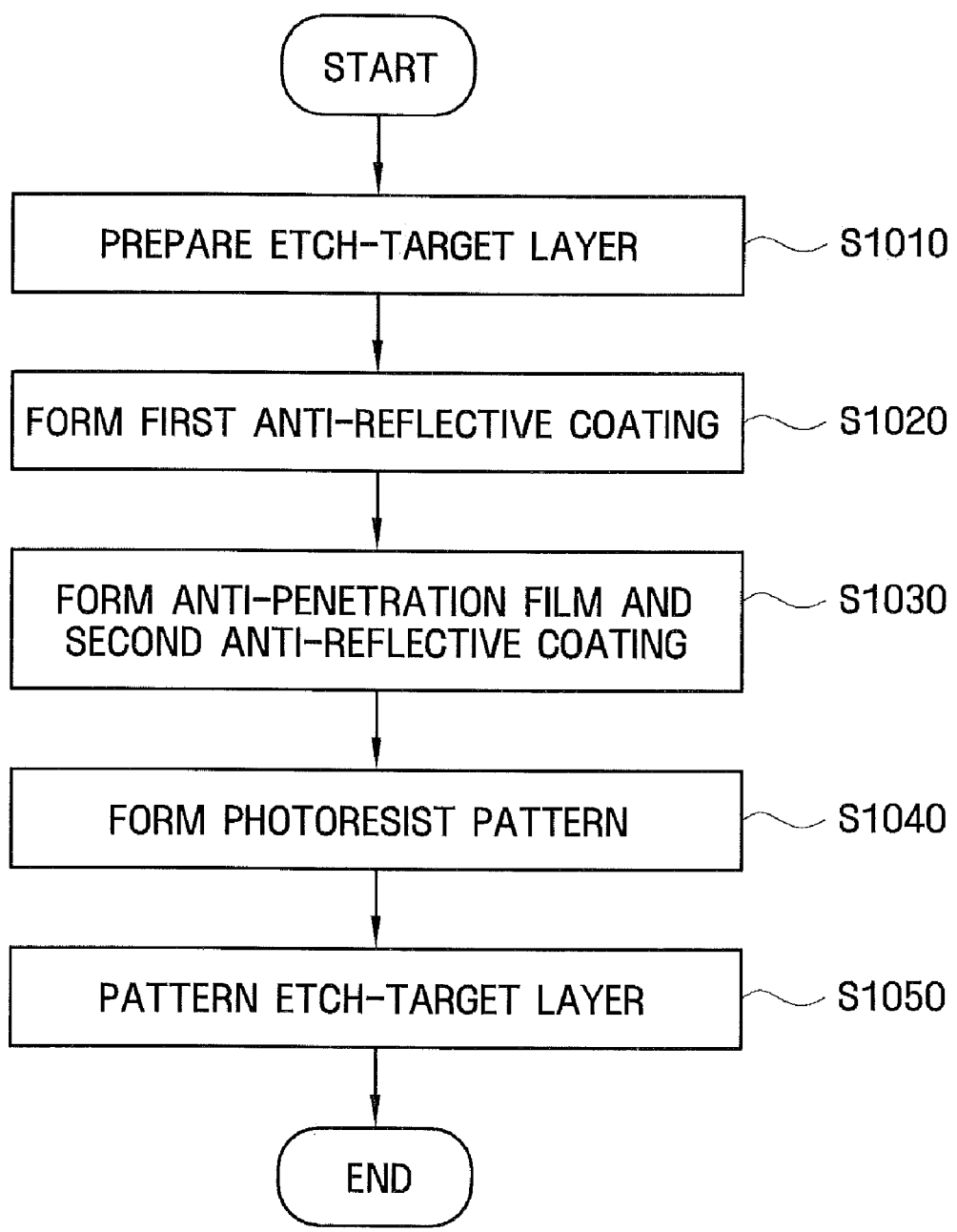
FIG. 2 is a flowchart illustrating a method of fabricating a semiconductor device according to a second exemplary embodiment of the present invention.
Figure 5:
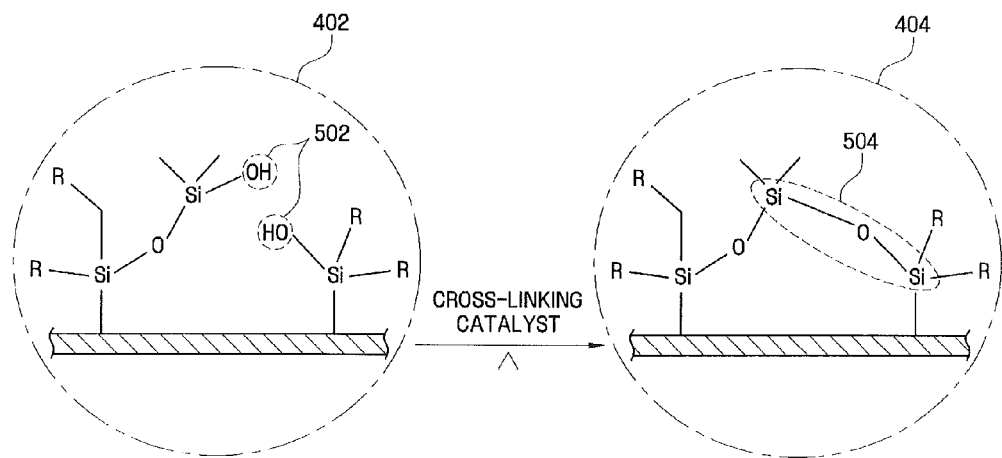
FIG. 5 is a diagram for explaining a net structure of an anti-penetration film.
Figure 6:
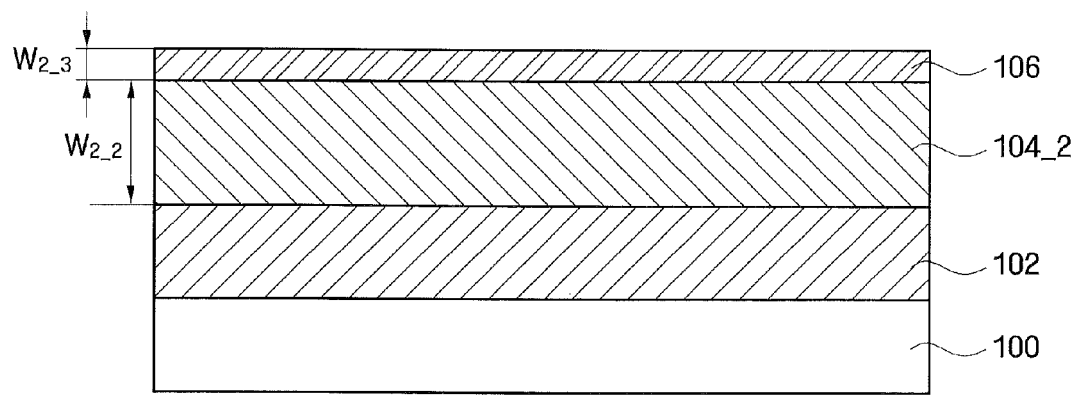
Figure 7:
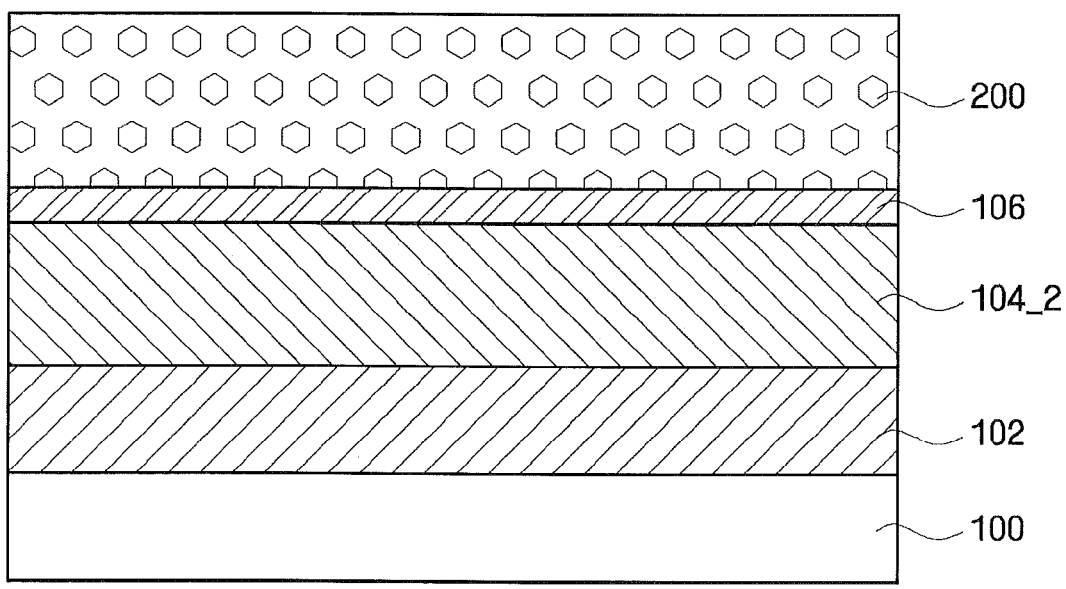

Hereinafter, a method of fabricating a semiconductor device according to a second exemplary embodiment of the present invention will be described with reference to FIGS. 1 through 11. FIG. 2 is a flowchart illustrating a method of fabricating a semiconductor device according to a second exemplary embodiment of the present invention. FIGS. 3, 4, 6 through 8, 10, and 11 are cross-sectional views showing intermediate processes included in the method of fabricating a semiconductor device according to the second exemplary embodiment of the present invention. FIG. 5 is a diagram for explaining a net structure of an anti-penetration film. FIG. 9 is an enlarged view of a region 'A' shown in FIG. 8.

Figure 3:
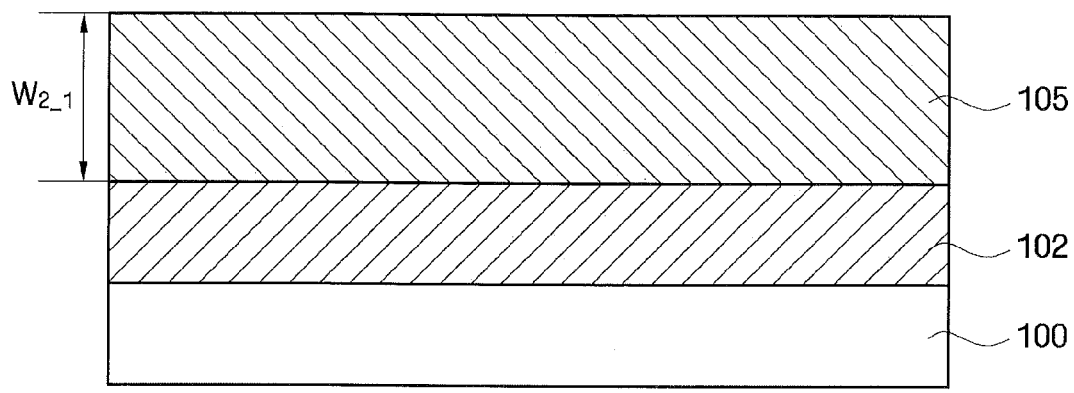
FIGS. 3, 4, 6 through 8, 10, and 11 are cross-sectional views showing intermediate processes included in the method of fabricating a semiconductor device according to the second exemplary embodiment of the present invention.
Figure 4:
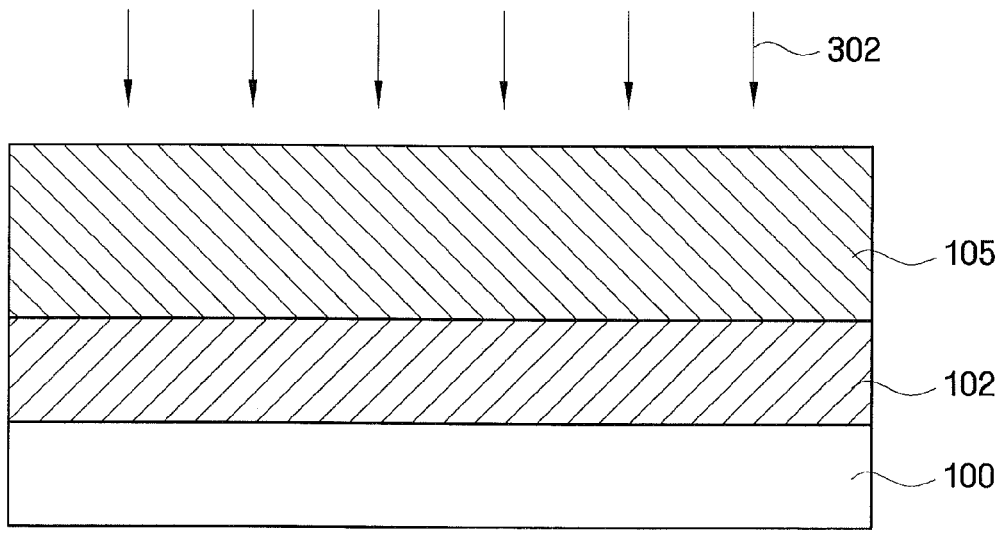

Referring to FIGS. 2 and 3, an etch-target layer 102 that is to be patterned is formed on a substrate 100 (operation S1010). The etch-target layer 102 may be, but is not limited to, a silicon nitride layer, a polysilicon layer, or a silicon oxide layer. Also, the etch-target layer 102 may be, but is not limited to, a conductive metal layer. The etch-target layer 102 may be formed by chemical vapor deposition (CVD) or sputtering. However, other thin-film formation methods than the above methods can also be used. If the substrate 100 is to be etched, the etch-target layer 102 may not be formed. Although not shown in a separate drawing, the surface of the substrate 100 or the etch-target layer 102 may be cleaned to remove contaminants remaining on the substrate 100 or the etch-target layer 102.

Next, a first anti-reflective coating 105 is formed on the substrate 100 or the etch-target layer 102 (operation S1020). The first anti-reflective coating 105 may be made of a composition containing silsesquioxane resin and a cross-linking catalyst. In addition, the first anti-reflective coating 105 may be formed on the substrate 100 or the etch-target layer 105 by CVD or spin coating. In the second exemplary embodiment of the present invention, the first anti-reflective coating 105 may be formed by spin coating in view of economy and ease of processing. The first anti-reflective coating 105 may be formed as follows. First, a composition containing silsesquioxane resin and a cross-linking catalyst is coated on the substrate 100 or the etch-target layer 102. Here, the composition may be coated on the substrate 100 or the etch-target layer 102 by spin coating. The coated composition is dried or baked to harden. The drying or baking process may be performed at 150 to 200° C. for less than approximately one minute.

The first anti-reflective coating 105 may be formed to a thickness $W2\_1$ of 30 to 100 nm. The first anti-reflective coating 105 is divided into a second anti-reflective coating 104_2 and an anti-penetration film 106 in a subsequent process. When the thickness $W2\_1$ of the first anti-reflective coating 105 is less than 30 nm, the second anti-reflective coating 104_2 and the anti-penetration film 106 cannot be formed to thicknesses that enable them to fully perform their functions. On the other hand, when the thickness W21 of the first anti-reflective coating 105 is greater than 100 nm, more etching members than necessary may be used to etch the second anti-reflective coating 104_2 and the anti-penetration film 106 which will be formed in a subsequent process. This can undermine the efficiency and economy of the entire process.

Next, referring to FIGS. 2 and 4 through 6, a cross-linking reaction is initiated in a region of the first anti-reflective coating 105, thereby forming the second anti-reflective coating 104_2 and the anti-penetration film 106 (operation S1030). Here, functions of the second anti-reflective coating 104_2 and the anti-penetration film 106 are substantially the same as those of the anti-reflective coating 104_1 and the anti-penetration film 106 according to the first exemplary embodiment and thus will not be described again.

The cross-linking reaction may be induced by heat treatment or exposure of a region of the first anti-reflective coating 105. When the cross-linking catalyst contained in the first anti-reflective coating 105 is exposed to heat or light energy, the cross-linking reaction takes place, causing the region of the first anti-reflective coating 105 to have the net structure.

Specifically, even if the first anti-reflective coating 105 hardens, it still contains hydroxy groups (—OH functional groups). The hydroxy groups (—OH functional groups) contained in the first anti-reflective coating 105 cause acid, which will be generated during the formation of a photoresist pattern 202 in a subsequent process, to diffuse from the photoresist pattern 202 to the first anti-reflective coating 105 relatively easily, resulting in pattern defects described above. To prevent this problem, the cross-linking reaction is initiated in an interface between the first anti-reflective coating 105 and the photoresist pattern 202 which contacts the first anti-reflective coating 105 or a region of the first anti-reflective coating 105 which is adjacent to the photoresist pattern 202, so that the region of the first anti-reflective coating 105 contains a relatively small number of hydroxy groups (—OH functional groups). Also, the cross-linking reaction in the region of the first anti-reflective coating 105 causes the region to have a net structure.

Referring to FIG. 5, the first anti-reflective coating 105 contains hydroxy groups (—OH functional groups) 502 before a cross-linking reaction (state 402). However, after the cross-linking reaction induced by a cross-linking catalyst (state 404), Si—O—Si bonds 504 are formed in a net structure in a region of the first anti-reflective coating 105. That is, a region of the first anti-reflective coating 105 is formed as the anti-penetration film 106, and the other region of the first anti-reflective coating 105 is formed as the second anti-reflective coating 104_2. Here, the anti-penetration film 106 may contain more Si—O—Si bonds than does the second anti-reflective coating 104_2. On the other hand, the second anti-reflective coating 104_2 may contain more hydroxy groups (—OH functional groups) than does the anti-penetration film 106.

The anti-penetration film 105 containing a relatively large number of Si—O—Si bonds may exhibit hydrophobic properties. Thus, if the photoresist pattern 202 is made of an organic material in a subsequent process, good adhesion can be obtained between the anti-penetration film 106 and the photoresist pattern 202.

A ratio of the thickness W2_1 of the first anti-reflective coating 105 to a thickness W2_3 of the anti-penetration film 106 may be 0.5 to 20. When the ratio of the thickness W2_1 of the first anti-reflective coating 105 to the thickness W2_3 of the anti-penetration film 106 is less than 0.5, the anti-penetration film 106 can fully prevent acid generated during the formation of the photoresist pattern 202 from diffusing to the underlying film. However, more etching members than necessary may be used to etch the anti-penetration film 106 in subsequent processes, thereby undermining the efficiency and economy of the entire process.

When the ratio of the thickness W2_1 of the first anti-reflective coating 105 to the thickness W2_3 of the anti-penetration film 106 is greater than 20, it may be difficult for the anti-penetration film 106 to prevent diffusion of acid generated during the formation of the photoresist pattern 202 into the underlying film. That is, the anti-penetration film 106 may not be able to fully perform its functions. For this reason, the thickness W2_3 of the anti-penetration film 106 may be 5 to 20 nm.

Since the second anti-reflective coating 104_2 is a portion of the first anti-reflective coating 105 excluding a portion formed as the anti-penetration film 106, the sum of a thickness W2_2 of the second anti-reflective coating 104_2 and the thickness W2_3 of the anti-penetration film 106 is equal to the thickness W2_1 of the first anti-reflective coating 105. Accordingly, the thickness W22 of the second anti-reflective coating 104_2 may be 10 to 95 nm.

The heat treatment process in the cross-linking reaction may be performed in a temperature range of 150 to 300° C. When the heat treatment temperature is lower than 150° C., the anti-penetration film 106 may not be formed satisfyingly. When the heat treatment temperature is higher than 300° C., the anti-penetration film 106 may be formed thicker than necessary. The exposure process in the cross-linking reaction may be performed at an exposure energy of 1 to 100 mJ/cm$^2$. At an exposure energy of less than 1 mJ/cm$^2$, the anti-penetration film 106 may not be formed satisfyingly. At an exposure energy of greater than 100 mJ/cm$^2$, the anti-penetration film 106 may be formed thicker than necessary. The exposure process may be performed using KrF, ArF, extreme ultraviolet (EUV), vacuum ultraviolet (VUV), an electron beam, an X ray, or an ion beam.

Next, referring to FIGS. 2 and 7 through 9, the photoresist pattern 202 is formed on the anti-penetration film 106 (operation S1040).

Specifically, a photoresist film 200 is formed on the anti-penetration film 106 and then patterned to form the photoresist pattern 202. Here, the photoresist film 200 may contain a photoacid generator. Next, the photoresist film 200 is soft-baked at approximately 80 to 160° C. for about 50 seconds. Here, an additional cross-linking reaction may occur in the anti-penetration film 106, thereby increasing the density of the net structure of the anti-penetration film 160. Consequently, the anti-penetration film 160 can more thoroughly prevent acid generated by the photoacid generator from penetrating into the underlying film.

Figure 8:
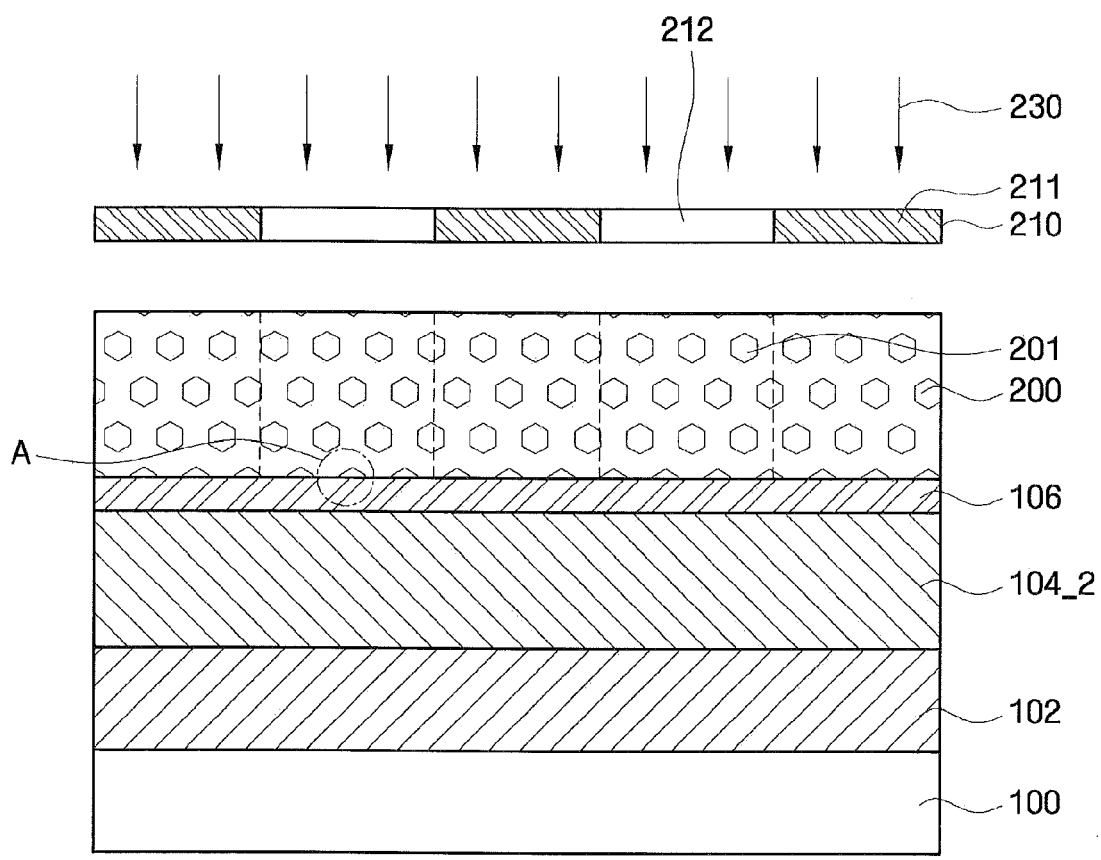
Figure 9:
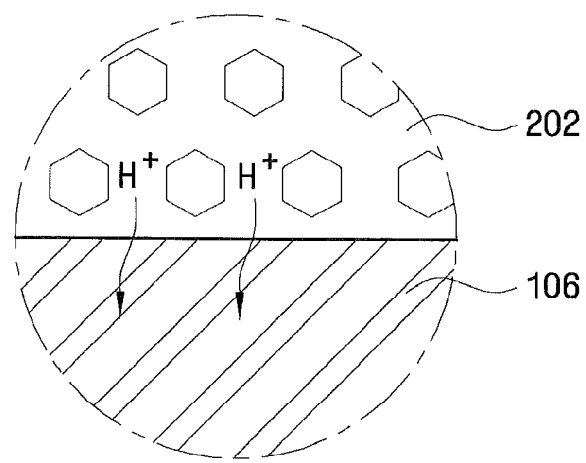
FIG. 9 is an enlarged view of a region 'A' shown in FIG. 8

Next, referring to FIG. 8, the photoresist film 200 is exposed using an exposure mask 210.

Specifically, the exposure mask 210 may be placed on the photoresist film 200 using an exposure device. The exposure mask 210 may be divided into a region 212 through which light can transmit and a region 211 through which light cannot transmit. In addition, the exposure mask 210 may have a predetermined pattern. If the exposure mask 210 is irradiated with light 230, a portion of the photoresist film 200 formed on the substrate 100 may selectively react to light that transmits through the exposure mask 210.

If the photoresist film 200 is a positive photoresist, exposed regions 201 of the photoresist film 200 may be relatively hydrophilic compared with unexposed regions thereof. Accordingly, the exposed regions 201 and the unexposed regions of the photoresist film 200 may differ in their solubility. Conversely, if the photoresist film 200 is a negative photoresist, the unexposed regions of the photoresist film 200 may be relatively hydrophilic compared with the exposed regions 201 thereof. The photoresist pattern 202 according to the second exemplary embodiment may be of a positive type or a negative type. However, for ease of description, it will be assumed that the photoresist pattern 202 according to the second exemplary embodiment is of the positive type. Referring to FIG. 9, a photoacid generator contained in the photoresist film 200 generates acid (H$^+$) in the exposed regions 201 of the photoresist film 200. The acid (H$^+$) may penetrate into an underlying film of the photoresist film 200. However, the anti-penetration film 106 can prevent the penetration of the acid (H$^+$) into the underlying film.

After the exposure of the photoresist film 200, the exposed photoresist film 200 is baked, so that a predetermined pattern transferred onto the photoresist film 200 can be easily dissolved in a predetermined solvent. That is, the unexposed regions of the photoresist film 200 are made to harden. The baking process may be performed at approximately 70 to 200° C. for about 50 seconds. Here, an additional cross-linking reaction may occur in the anti-penetration film 106, thereby increasing the density of the net structure of the anti-penetration film 160. Consequently, the anti-penetration film 160 can more thoroughly prevent acid generated by the photoacid generator from penetrating into the underlying film.

Next, referring to FIG. 1, the exposed photoresist film 200 is developed to form the photoresist pattern 202. Here, the exposed regions 201 of the photoresist film 200 may be dissolved in a developer solution and then removed to form the photoresist pattern 202. The developer solution may be an aqueous solution of 0.01 to 5% tetramethylammonium hydroxide (TMAH) by weight.

Figure 10:
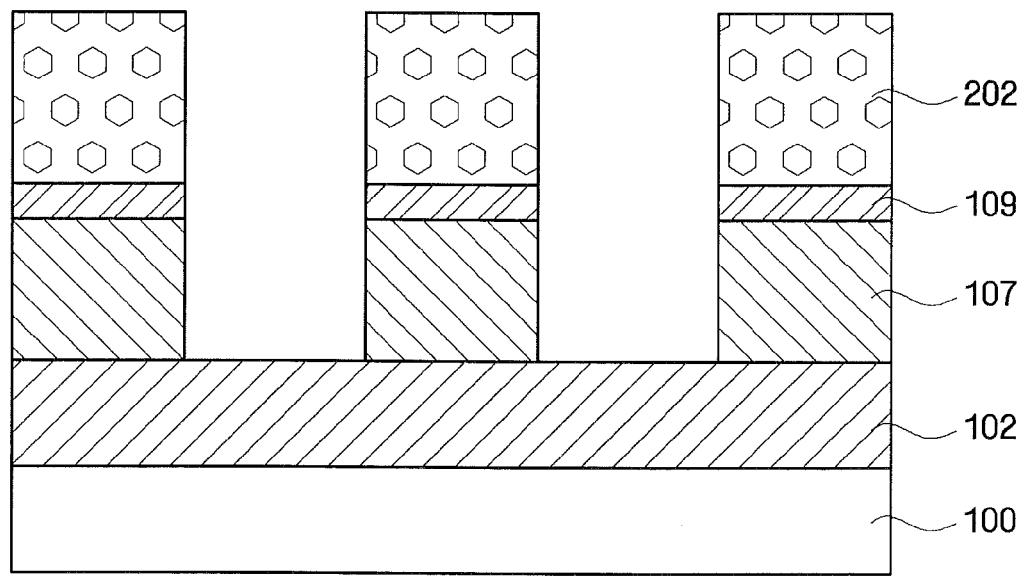
Figure 11:
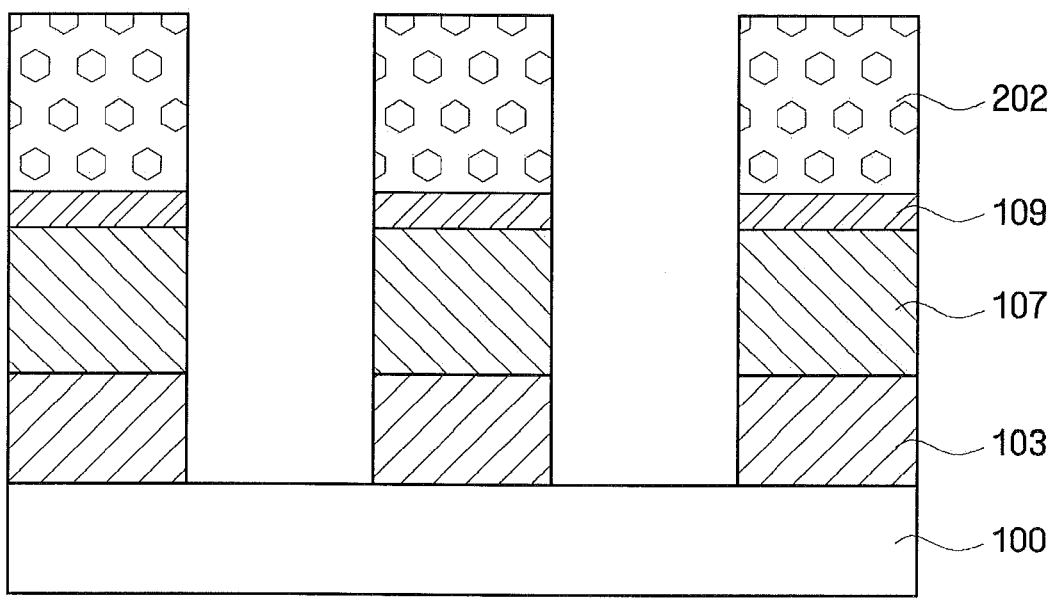

Next, referring to FIGS. 1, 10, and 11, the etch-target layer 102 is patterned using the photoresist pattern 202 (operation S1050).

Referring to FIG. 10, portions of the anti-penetration film 106 which correspond respectively to portions of the photoresist pattern 202 in which the photoresist film 200 is not formed are etched to pattern the etch-target layer 102. As a result, an anti-penetration film pattern 109 identical to the photoresist pattern 202 is formed. Then, a second anti-reflective coating pattern 107 identical to the photoresist pattern 202 is formed using the photoresist pattern 202 and the anti-penetration pattern 109.

Referring to FIG. 11, the etch-target layer 102 is patterned using the photoresist pattern 202, the anti-penetration film pattern 109, and the second anti-reflective coating pattern 107 as etch masks.

According to the second exemplary embodiment, since a pattern transferred onto a photoresist film can be improved, a better pattern profile with enhanced resolution can be formed.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of forming an integrated circuit device, comprising:
    forming an anti-reflective coating comprising a silsesquioxane resin and a cross-linking catalyst on a substrate;
    forming an anti-penetration film on the anti-reflective coating by using the cross-linking catalyst within the anti-reflective coating to cause a cross-linking reaction within a surface region of the anti-reflective coating, said anti-penetration film consisting of a material having a greater density of Si—O—Si bonds therein relative to the anti-reflective coating;
    patterning a photoresist layer on the anti-penetration film; and
    selectively etching the anti-penetration film and the anti-reflective coating in sequence using the patterned photoresist layer as an etching mask.

2. The method of claim 1, wherein the material in the anti-penetration film is hydrophobic.

3. The method of claim 1, where a ratio of a thickness of the anti-reflective coating relative to the anti-penetration film is in a range from about 0.5 to about 19.

4. The method of claim 1, wherein a thickness of the anti-penetration film is in a range from about 5 nm to about 20 nm.

5. The method of claim 4, wherein a thickness of the anti-reflective coating is in a range from about 10 nm to about 95 nm.

6. The method of claim 1, wherein a thickness of the anti-reflective coating is in a range from about 10 nm to about 95 nm.

7. A method of fabricating a semiconductor device, the method comprising:
    preparing a substrate or an etch-target layer which is to be patterned;
    forming a first anti-reflective coating, which contains silsesquioxane resin and a cross-linking catalyst, on the substrate or the etch-target layer;
    forming an anti-penetration film and a second anti-reflective coating by causing a cross-linking reaction in a region of the first anti-reflective coating; and
    forming a photoresist pattern on the anti-penetration film.

8. The method of claim 7, wherein the forming of the first anti-reflective coating comprises coating a composition, which contains the silsesquioxane resin and the cross-linking catalyst, on the substrate or the etch-target layer and hardening the coated composition.

9. The method of claim 7, wherein the cross-linking reaction is induced by heat treatment or exposure of the first anti-reflective coating.

10. The method of claim 7, wherein the forming of the anti-penetration film comprises forming the region of the first anti-reflective coating in a net structure.

11. The method of claim 10, wherein the anti-penetration film contains more Si—O—Si bonds than does the second anti-reflective coating.

12. The method of claim 11, wherein the anti-penetration film is hydrophobic.

13. The method of claim 10, wherein the second anti-reflective coating contains more hydroxy groups (—OH functional groups) than does the anti-penetration film.

14. The method of claim 7, wherein a ratio of a thickness of the first anti-reflective coating to that of the anti-penetration film is 1.5 to 20.

15. The method of claim 14, wherein the thickness of the first anti-reflective coating is 30 to 100 nm.

16. The method of claim 15, wherein the thickness of the anti-penetration film is 5 to 20 nm.

17. The method of claim 7, wherein the forming of the photoresist pattern comprises forming a photoresist film on the anti-penetration film, exposing the photoresist film, hardening the exposed photoresist film, and developing the hardened photoresist film.

18. The method of claim 17, wherein the photoresist film contains a photoacid generator.

19. The method of claim 18, wherein the cross-linking reaction additionally occurs during the exposing of the photoresist film or the hardening of the exposed photoresist film.

20. A method of forming an integrated circuit device, comprising:
    forming an anti-reflective coating comprising a silsesquioxane resin and a cross-linking catalyst, on a substrate; and
    converting a surface of the anti-reflective coating into an anti-penetration film by using the cross-linking catalyst within the anti-reflective coating to cause a cross-linking reaction within the surface of the anti-reflective coating, said converting comprising heating the anti-reflective coating at a temperature in a range from about 150° C. to about 300° C. and/or exposing the anti-reflective coating to at least one of KrF, ArF, extreme ultraviolet (EUV), vacuum ultraviolet (VUV), electron beam, X-ray beam and ion beam radiation.

21. The method of claim 20, wherein said converting is followed by a step of depositing a layer of photoresist material on the anti-penetration film.

* * * * *